(12) United States Patent
Kaiser et al.

(10) Patent No.: US 7,731,166 B2
(45) Date of Patent: Jun. 8, 2010

(54) UNIVERSAL INSERT SUPPORT FOR HOLDING AND POSITIONING PARTS OF COMPLEX SHAPES

(75) Inventors: Clement Kaiser, Montauban (FR); Francis Bourrieres, Montauban (FR)

(73) Assignee: Novatec SA, Montauben (FR)

( * ) Notice: Subject to any disclaimer, the term of this patent is extended or adjusted under 35 U.S.C. 154(b) by 681 days.

(21) Appl. No.: 11/579,758

(22) PCT Filed: May 9, 2005

(86) PCT No.: PCT/FR2005/001171

§ 371 (c)(1),
(2), (4) Date: Nov. 8, 2006

(87) PCT Pub. No.: WO2005/116512

PCT Pub. Date: Dec. 8, 2005

(65) Prior Publication Data

US 2008/0029945 A1    Feb. 7, 2008

(30) Foreign Application Priority Data

May 12, 2004   (FR)   ................................... 04 05113
Nov. 17, 2004  (FR)   ................................... 04 12165

(51) Int. Cl.
  *B25B 11/00*   (2006.01)
  *B23Q 3/00*    (2006.01)
(52) U.S. Cl. .................................... 269/21; 269/289 R
(58) Field of Classification Search ................ 269/266, 269/21; 254/93 HP; 248/363; 206/524, 206/524.8, 497; *F16M 13/00*
See application file for complete search history.

(56) References Cited

U.S. PATENT DOCUMENTS

| 3,212,497 | A | * | 10/1965 | Dickinson | .................... 602/6 |
| 3,762,404 | A | * | 10/1973 | Sakita | .......................... 602/6 |
| 3,830,896 | A | * | 8/1974 | Flicker et al. | .............. 264/45.2 |
| 5,246,216 | A | * | 9/1993 | Oberst | ........................ 269/266 |
| 5,351,830 | A |   | 10/1994 | Bender et al. | |
| 6,254,959 | B1 | * | 7/2001 | Hirano et al. | ................ 428/71 |
| 6,318,372 | B1 | * | 11/2001 | Hiebert | ....................... 128/869 |
| 6,709,617 | B2 | * | 3/2004 | Wu | ............................ 264/222 |

FOREIGN PATENT DOCUMENTS

| DE | 4313778 | 11/1994 |
| DE | 4324508 | 1/1995 |
| EP | 0466597 | 1/1992 |
| FR | 2045451 | 2/1971 |
| FR | 2603256 | 3/1988 |
| WO | WO9105200 | 4/1991 |

* cited by examiner

*Primary Examiner*—Joseph J Hail, III
*Assistant Examiner*—Jamal Daniel
(74) *Attorney, Agent, or Firm*—Vidas, Arrett & Steinkraus

(57) ABSTRACT

The invention concerns a process and the associated universal device for supporting a part (1) of random and/or possibly complex shape in relation to a rigid base (11) while establishing a work reference. It consists of inserting between the part to be held and the rigid base (11), at least one deformable airtight enclosure (3) of constant volume full of incompressible particles (4). Then vacuum is applied inside the deformable enclosure (3) of constant volume using a vacuum source (5) which can be connected to the deformable enclosure (3). Thus the particles (4) amalgamate to constitute a solid block which at least partially rests on the rigid base (11) and holds the part (1) matching its shapes.

11 Claims, 6 Drawing Sheets

UNIVERSAL INSERT SUPPORT FOR HOLDING AND POSITIONING PARTS OF COMPLEX SHAPES

FIELD OF THE INVENTION

This invention concerns a universal process and device for supporting or holding a part of random and/or possibly complex shape at a work level determined in relation to a rigid base.

BACKGROUND OF THE INVENTION

There are many fields of application for this process, for example, it could be used to hold or support parts so that they can be processed. By way of non-limiting example, the process can be used to support and hold electronic printed circuits during different stages of assembly such as serigraphy, depositing and measuring out glue or solder by syringe, fitting components, re-melting, etc.

PREVIOUS TECHNIQUES

Other types of universal supports have been used in the past to support electronic cards. Some of these supports as described in the U.S. Pat. No. 6,711,797 consist of juxtaposed pneumatic or hydraulic jacks whose struts, when activated, come into contact with the part to be supported. These devices have the disadvantage of only supporting the electronic card on a plumb line with the jack struts. In fact even if the struts have elastomer studs, the area supported by each strut is limited to the contact zone between the stud and the card. So when a stress is applied on the card, for example during scraping on a serigraphy machine, a stress of several hundred grams or even kilograms may be locally applied. This can naturally lead to damage to the electronic components which are subjected to these stresses.

Another type of device for supporting electronic cards marketed by Speedline Technologies under the name of GEL-FLEX consists of placing flexible elements under the card. The flexibility of these elements containing silicone gel allows them to conform to the variations in height of the card to be supported. This type of device generates fewer local stresses on the components, but on the other hand during the passage of the scraper, the flexibility of the elements causes these elements to be crushed. Moreover, the flexibility of these elements generates a stress on the printed circuit to be supported, causing an upward deflection of the product to be supported. This is all the more critical if the printed circuit is thin. This type of universal support therefore does not completely fulfil its function which is to hold the card in a fixed plane during the various assembly operations.

The device described in the EP0466597 patent allows the rigidity of thin parts to be increased so that they may be machined, by means of an agglomeration of particles among each other and against a surface of the part, by applying a vacuum in an enclosure consisting of the part itself and a soft envelope. This technique makes it possible to obtain a "virtual" increase in thickness of the part in order to hold it. This technique therefore requires the following:

the part to be made more rigid must be "airtight", which is not the case with electronic cards which may comprise holes or grooves;
  the particles must be in direct contact with the part to be held. For this, the part to be processed must therefore be able to permit this direct contact without risk of damage or pollution from the particles (for example some electronic cards cannot be processed in this way);
  the soft envelope must be attached hermetically to the part to be machined, which is inconceivable in the case of electronic cards.

Moreover when this technique is used, if the particles are not in close contact with the whole of the part at the moment when vacuum is applied or if there is a compressible space in the enclosure, there is the risk of deforming or creating stresses on the part. The field of application of this process is therefore limited to holding very particular parts, which are airtight, and for which contact with the particles is acceptable. In addition, its implementation requires a mounting for attaching the soft envelope, specific to the shape of each part, which is precisely one of the major points that this invention is trying to avoid. In fact, for this patent it is necessary to make a sealed enclosure consisting of the part and a soft membrane.

Finally the most common method of supporting electronic cards is a dedicated support which is machined specifically to the profile of each electronic circuit. This method has several disadvantages, which are a high retail price, a rather long performance time, it does not accept modifications to the electronic circuits and finally it does not accept changes in dimensions and/or positions of electronic components because of the inflexibility of this form of tooling.

The WO91/05200, DE4313778, U.S. Pat. No. 5,351,830, FR2045451, U.S. Pat. No. 3,762,404, DE4324508 and FR2603256 patents describe deformable envelopes containing particles in which a vacuum can be applied so as to agglomerate these particles and thus make the envelope rigid while taking the shape of the bodies to be immobilised. These devices are intended both for immobilising and transporting injured persons, and for holding and protecting parts during transport or to allow the parts to be worked on. None of these documents guarantees that there will be no change in volume of the enclosure when the vacuum is applied. This characteristic is essential in the case of the universal insert referred to in this patent application. In fact by way of example, when trying to support an electronic card on a conveyor, it is vital for the insert of this invention to remain immobilised exactly, without shrinking, at a reference level perfectly defined by the work position, in the state it is in at the moment when the vacuum is applied, so that it is always in contact with the part to be supported. All references to the previous techniques mentioned try to make the enclosure match only the shape of the body to be supported, and at no time do they try to do so at a constant volume and to establish a perfectly defined work reference. Bearing in mind this requirement, the chamber containing the particles according to the invention has a constant volume, which requires the use of incompressible particles, contrary to these patents in which the use of compressible particles is recommended to improve locking or to retain some elasticity of the locked assembly. Such devices are therefore not able to resolve the problem posed.

Moreover, none of the references quoted recommends increasing the capacity to accept large deformations during the period when vacuum is not applied inside the deformable enclosure.

More particularly, the U.S. Pat. No. 3,762,404 describes a system for holding and immobilising patients for transport or treatment. For this purpose, it recommends partially filling a deformable enclosure with particles (cf. line 50, column 1, FIG. 2, line 53 column 2), partial filling permitting greater mobility of the particles. In addition, this document recommends using deformable particles (cf. line 45 column 2, line 11 column 4) which amalgamate better under localised deformation. As may be observed, this document does not try to immobilise the airtight enclosure with a constant volume, as when the vacuum is applied, the airtight enclosure will shrink to compensate for the volume not filled with particles and for the change in volume associated with the crushing of deformable particles. This device does not aim to, and consequently does not make it possible to, establish a perfectly controlled reference work level. In addition, this document does not teach us anything about the possibility of permitting large deformations by the deformable enclosure. The document envisages the possibility of making cutouts for a limb to pass through (cf. line 27 column 5 and FIGS. 7 and 8), but these cutouts do not constitute a volume which is intended to be crushed to permit large deformations of the enclosure when the part and the enclosure are put into contact with each other. The document also recommends making partitions in the deformable enclosure so as to make compartments and thus ensure a better distribution of the particles throughout the device. These partitions are not intended to permit large deformations of the enclosure when the part and the enclosure are put into contact with each other, in order to correctly control the reference work level, by the crushing of the partition zone.

Similarly, the FR 2,045,451 document recommends another device for immobilising a patient during transport or treatment. Here too the use of compressible particles (cf. line 29 page 2, line 8 page 7) is recommended to ensure better locking by the crushing of the particles. However this document does not recommend filling the deformable enclosure completely with particles. Consequently the device described in this document does not cause the locking of the enclosure at a constant volume. This document does not teach us anything on the possibility of permitting large deformation and establishing a well-controlled reference work level. In FIG. 2, one may observe a thinner area on the separating join between the two compartments of the deformable enclosure. The purpose of this thinner area is to prevent the particles from moving freely in all the devices and to distribute them more evenly. This thinner area does not allow itself to be crushed nor is it intended to be crushed when the part is placed in contact with the enclosure so as to permit large deformations.

In all cases, whether for the U.S. Pat. No. 3,762,404 or FR2,045,451 patent, these partitions do not constitute a concave shape intended to be crushed when the enclosure is placed in contact with the part in order to establish a very well-controlled reference work level. These partitions enable a large enclosure to be subdivided into smaller convex enclosures to ensure a better distribution of the particles.

BRIEF SUMMARY OF THE INVENTION

The object of this invention is to provide a universal insert support which adapts automatically to the shape of the part to be supported and at a reference work level that can easily be incorporated in a piece of equipment or an automated line for the purpose of processing in a very flexible manner parts of random and/or possibly complex shape without having to spend a long time configuring the part support or to invest in tooling which is specific to a product.

The invention is basically characterised in that it consists of:
  inserting between the part to be held at a determined level and a rigid base, at least one deformable closed enclosure of constant volume, which is airtight and full of incompressible particles that are preferably small in relation to the points in relief of the part to the held;
  applying a vacuum inside the deformable closed enclosure of a constant volume using a vacuum source which can be connected to the deformable enclosure so that the particles amalgamate without changing volume, to constitute a solid block which at least partially rests on the rigid base and holds the part by matching its shapes to the determined work level.

According to another characteristic of the invention, to permit the enclosure(s) to accept large deformations and thus allow it/them to conform to the part to be supported and memorise a precise work reference, it is wise for the enclosure(s) to present one or several concave shapes open to the exterior of the enclosure or enclosures, so that the concave shape is crushed when the enclosure(s) and the part are put into contact with each other. Thus the universal insert according to this invention permits large deformations when vacuum is not applied inside the said enclosure(s). In order to give some elasticity to the universal insert and thus allow it to conform perfectly to the part to be supported while establishing the work reference level, it may be wise to partially or fully fill the concave shape(s) with an elastic body. By way of example, this elastic body may be open-cell polyurethane foam which deforms in an elastic manner when the part is placed in contact with the airtight enclosures. Obviously the elastic body may be selected in accordance with the desired elasticity. Another function of this elastic body is to return the deformable enclosure(s) to their initial state once the vacuum is cancelled.

According to another characteristic of the invention, it is essential for the deformable enclosure to be in contact both with the part to be maintained at the determined work level, matching its shapes, and with the rigid base on which the part has to be held. Direct contact with the rigid base may be limited to one or several points. Thus when the vacuum is induced inside the deformable enclosure with constant volume, the resulting solid block rests directly on the rigid base and holds the part, matching the shapes of the latter while establishing the work reference.

According to another characteristic of the invention, the conforming of the universal insert can take place at each change of part on the equipment considered, but it will preferably take place at the beginning of each series of identical parts.

According to this invention, the conforming of the insert consists of placing the part to be held, which may be the first object in the series, in contact with the airtight enclosure, in a work position, when there is no vacuum in the enclosure. Thus the deformable enclosure comes to match the shape of the part to be held without generating high stresses. When the work position involving close contact is obtained, vacuum is applied in the airtight enclosure which causes the amalgamation of the incompressible particles and immobilises the assembly in a solid block which behaves like a dedicated part holder resting on the rigid base. So when a series of identical products is to be made, it will be preferable to conform the support with the first part which serves as a conforming and positioning template and to maintain the vacuum in the airtight enclosure for the entire series of identical parts to be produced. Thus the universal insert behaves like a dedicated tool for the whole series of parts to be made. In fact when the vacuum is initially applied once the multi-shaped object to be held has been placed in contact and supported in the work position on the deformable enclosure, the latter deforms to match all the points in relief imposed by the multiform object and memorises the shape and reference work level indefinitely until the vacuum in the enclosure is cancelled.

According to another characteristic of the invention, so that the conforming and the reference level are always identical, it is essential for the deformable enclosure to be fully filled with incompressible particles. In fact, in so far as the particles are incompressible and they occupy the whole volume available in the enclosure, application of the vacuum will not cause any change in volume of the deformable enclosure. This is particularly important as it is vital for the universal insert to be immobilised exactly, without shrinking or change in volume, in the state it is in at the moment when vacuum is applied, in order to ensure not only conforming but a perfectly repetitive work position for all the objects in the series to be processed. Thus in all cases, the internal volume of the deformable enclosure is constant.

According to another characteristic of the invention, in so far as the deformable enclosure is perfectly airtight and the hole for applying the vacuum in the enclosure comprises a plugging system, it is not necessary to leave the vacuum source permanently connected to the enclosure. In fact, after applying the vacuum, it is perfectly conceivable to plug the vacuum feed hole and disconnect the vacuum source until the next time the insert is conformed. This is particularly wise, as the insert according to the invention may be used independently and does not require a permanent electrical or compressed air supply. For this purpose, it may be wise to add a vacuum reserve to make up for possible leaks. This vacuum reserve may be placed directly on the level of the module(s) and may be shared or specific to each insert module, or be removed.

According to another characteristic of the invention, the closed enclosure is elastic and has a memory so that when the vacuum inside the said deformable enclosure is cancelled, it regains its initial shape.

According to another characteristic of the invention, it is preferable for the concave zone to be situated under the deformable enclosure facing the zone supporting the part to be supported. Thus when the part is placed in contact on the support insert, the airtight enclosure is deformed at constant volume as it is totally filled with incompressible particles, while the concave zone situated under the enclosure is crushed and undergoes a change in volume. When the airtight enclosure has matched the shapes of the part to be supported up to the reference work level of the said part, the vacuum is applied in the said enclosure to immobilise the assembly in the state it is in and without shrinkage. To return to the initial state, the vacuum is cancelled in the enclosure and the elasticity of the soft membrane combined with the concave shape ensure the return to the initial position. To ensure a better return to the initial position, it may be wise to place an elastic body in the concave shape, which is crushed when the part to be supported is placed in contact with the device of the invention and which uncompresses when it returns to its initial position. Thus the device according to the invention has a double shape memory, the first at rest is always identical, and the second at work for the whole series of parts establishing simultaneously the complex shape and the reference work level.

Other characteristics of the invention will appear in the description of the attached figures which are given by way of non-limiting example.

BRIEF DESCRIPTION OF THE DRAWINGS

A detailed description of the invention is hereafter described with specific reference being made to the drawings.

DETAILED DESCRIPTION OF THE INVENTION

Figure 1A:
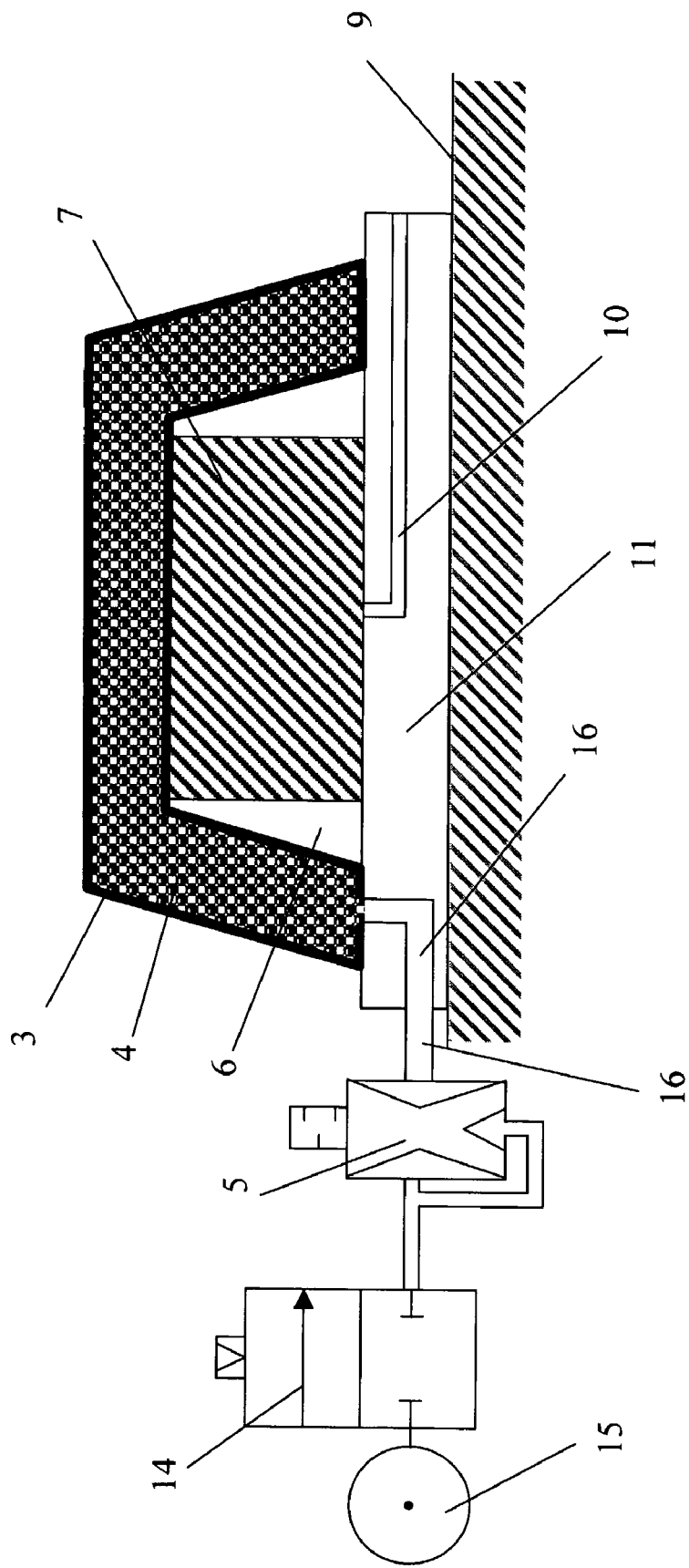
FIGS. 1a-1c show a section of a universal insert according to the invention.
Figure 1B:
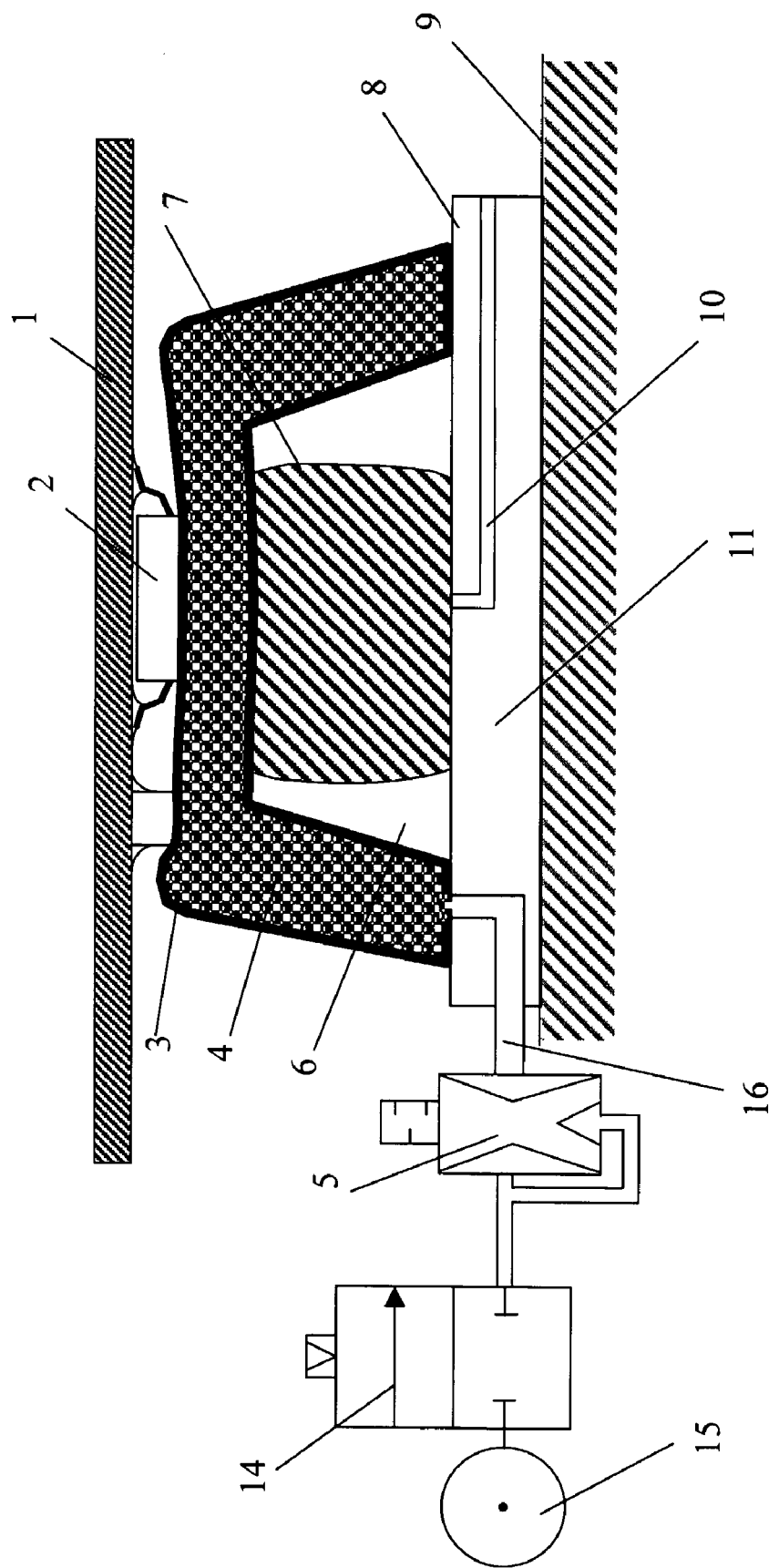
Figure 1C:
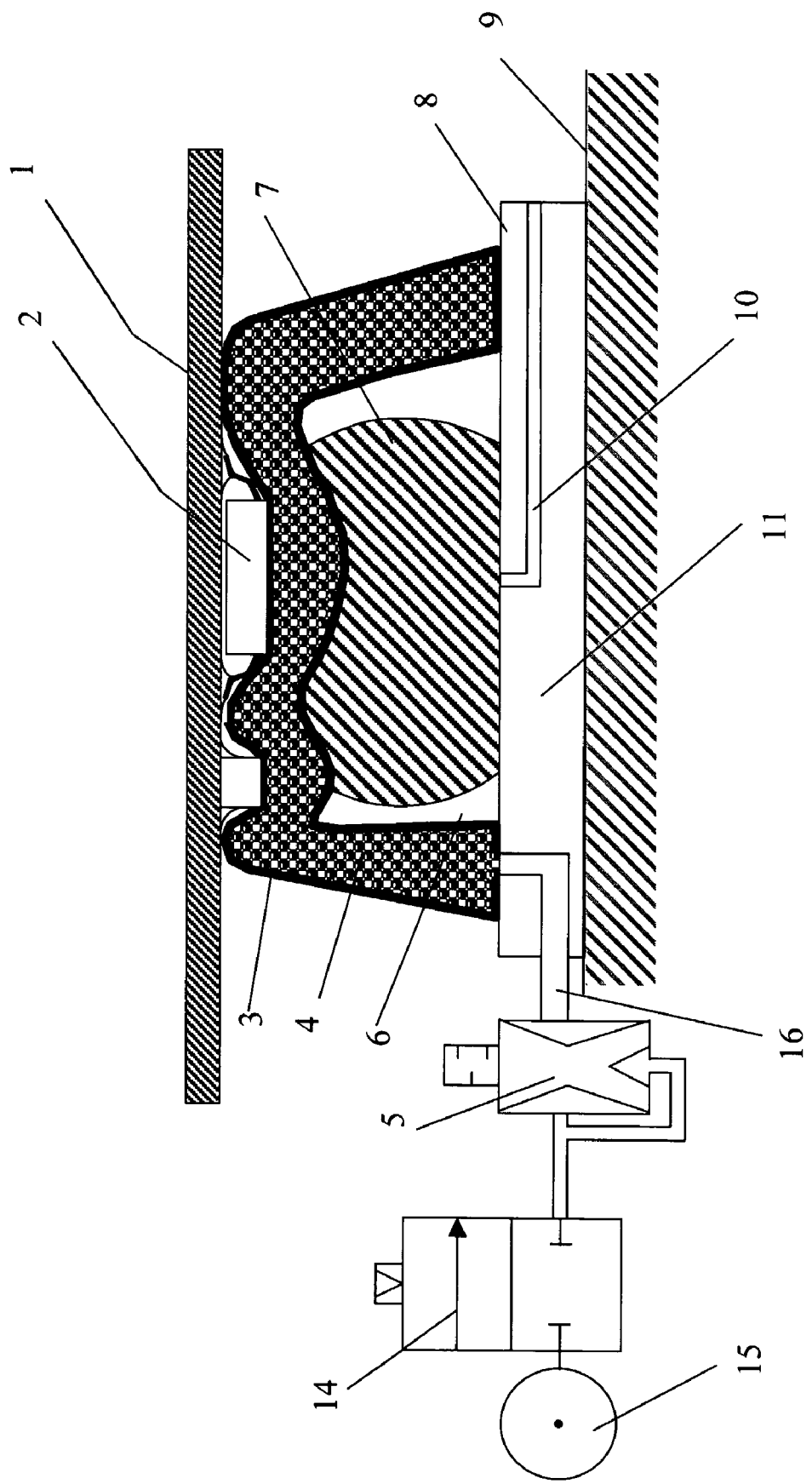

FIG. 1 shows a schematic representation and a section of a device according to this invention. A closed, airtight and deformable enclosure of constant volume is filled with incompressible particles (4). A vacuum generator (5) is connected to the airtight enclosure. The enclosure (3) comprises on the outside a concave shape (6) partly filled by an elastic element (7) which gives some elasticity to this assembly forming an insert. The concave shape is open to the outside of the enclosure and a vent (10) permits the discharge or intake of air into the concave zone during crushing or return to the rest position of the airtight enclosure. The universal support insert shown constitutes a module that can be handled as it has a rigid base (11) that can be magnetic and is intended to rest directly or indirectly on the frame (9) of the machine.

FIG. 1 a shows the device at rest as the vacuum generator (5), which here is a venturi, is not supplied because the distributor (14) is cutting the compressed air feed from the source (15), In this position, the inside of the enclosure (3) is at atmospheric pressure and the assembly can therefore be deformed in accordance with an elasticity partially given by the flexible element (7).

FIG. 1 b shows a section of the device according to the invention when it is placed in contact with the electronic card to be held. The vacuum generator (5) is not yet activated and it may be observed that the enclosure (3) has partially conformed to the random and/or possibly complex shapes of the electronic card (1) comprising components mounted on the surface (2). The conforming will be closer or less close depending on the size of the incompressible particles (4) and the thickness of the deformable membrane constituting the airtight enclosure (3). So that the device may match the shapes of the body to be supported as closely as possible, it is best to use the smallest possible particles. By way of example, to support an electronic card (1) very good results are obtained by using particles ranging from 0.5 to 5 mm (millimetre) in size, depending on the desired closeness of conforming, with a deformable membrane of 0.2 to 1.5 mm thickness with vacuum levels ranging from 50 to 90%. In all cases, the particles consist of a hard material such as plastic or metal to avoid any crushing when the vacuum is applied. To obtain a close contact between the part to be held and the supporting insert of this invention, a deformable membrane of an elastic material such as silicone, EPDM or polychloroprene will preferably be used.

In FIG. 1 c, the device is shown in the active position. The vacuum generator (5) is supplied with compressed air and consequently a vacuum is made in the airtight enclosure (3). Under the effect of the difference in pressure between the outside and the inside of the enclosure (3), the incompressible particles (4) are compressed against each other without being deformed, which has the effect of immobilising all the particles in a solid block which on the one hand matches more or less closely the shape of the product to be held (1), and on the other hand at least partially rests on the rigid base (11). To limit the compressed air consumption, if a venturi is the vacuum source, it may be wise to use a regulated venturi. A valve, not shown, on the pipe (16) allows the device according to the invention to be cut off from the vacuum source once the vacuum has been achieved. Thus the device may be moved between different work stations without disrupting the support of the part (1). As has already been mentioned above, it is essential in this invention for the enclosure (3) to be totally filled with incompressible particles, in order to preclude any shrinkage of the enclosure when the vacuum is applied. Moreover, to avoid the particles being compacted after several conforming operations, incompressible particles (4) of basically identical shape and size will preferably be chosen. Thus when the airtight enclosure is returned to atmospheric pressure, the particles immediately regain their mobility and therefore permit conforming to a new part. For this purpose, and according to another characteristic of the invention, particles which are basically spherical, of roughly the same diameter and hard are particularly suitable. The roughness and shape of the particles will make it possible to adjust the level of locking obtained when the vacuum is applied. In fact the particles are selected on the one hand so as to ensure some fluidity for the period when vacuum is not applied in the deformable enclosure, and on the other hand to ensure effective locking when the vacuum is applied.

Figure 2:
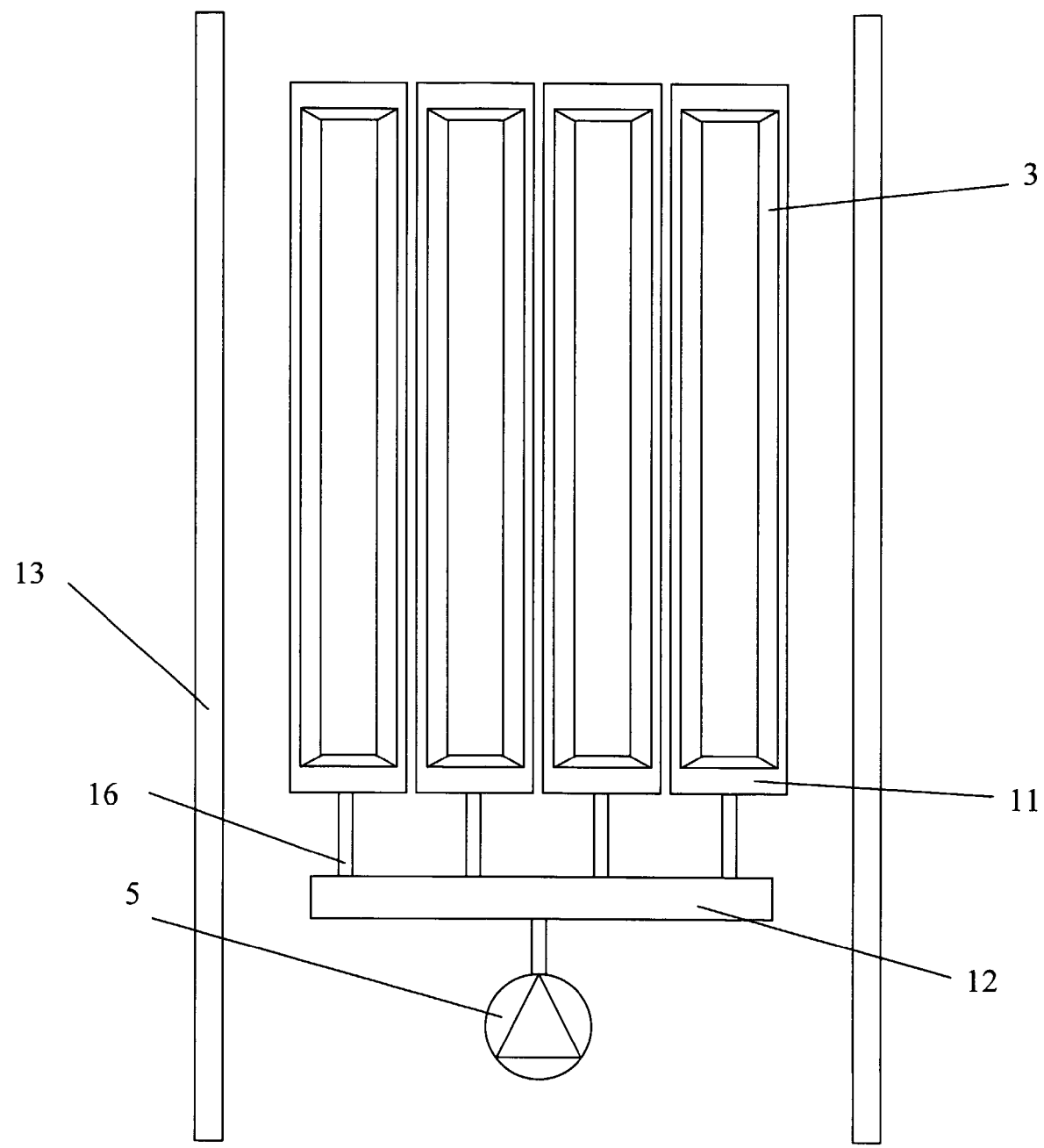
FIG. 2 shows a view from above of a device according to this invention implemented on an automatic machine.

FIG. 2 shows schematically and in a view from above an example of the implementation of this invention. Several modules according to the invention are placed side by side to adapt to the width of an electronic card transported by the conveyor (13) whose width is adjustable by a device which is not shown. In this case, four modules according to the invention are connected to a reservoir (12) which is in turn connected to a vacuum source (5). The rigid bases (11) of each module are magnetic and it is possible to remove or add modules thanks to a quick-connection system on the reservoir (12). So with this invention, it is possible to offer a modular universal support or holding system which can be adapted to the width of the product to be held and/or supported. This arrangement is particularly suitable for holding electronic cards during the different stages of the assembly process. By way of non-limiting example, the device and process which are the subject of this invention can be implemented on a serigraphy machine or a machine for fitting surface-mounted components. In this type of application, the membrane constituting the enclosure (3) will be manufactured out of an anti-static material such as EPDM or polychloroprene.

Figure 3:
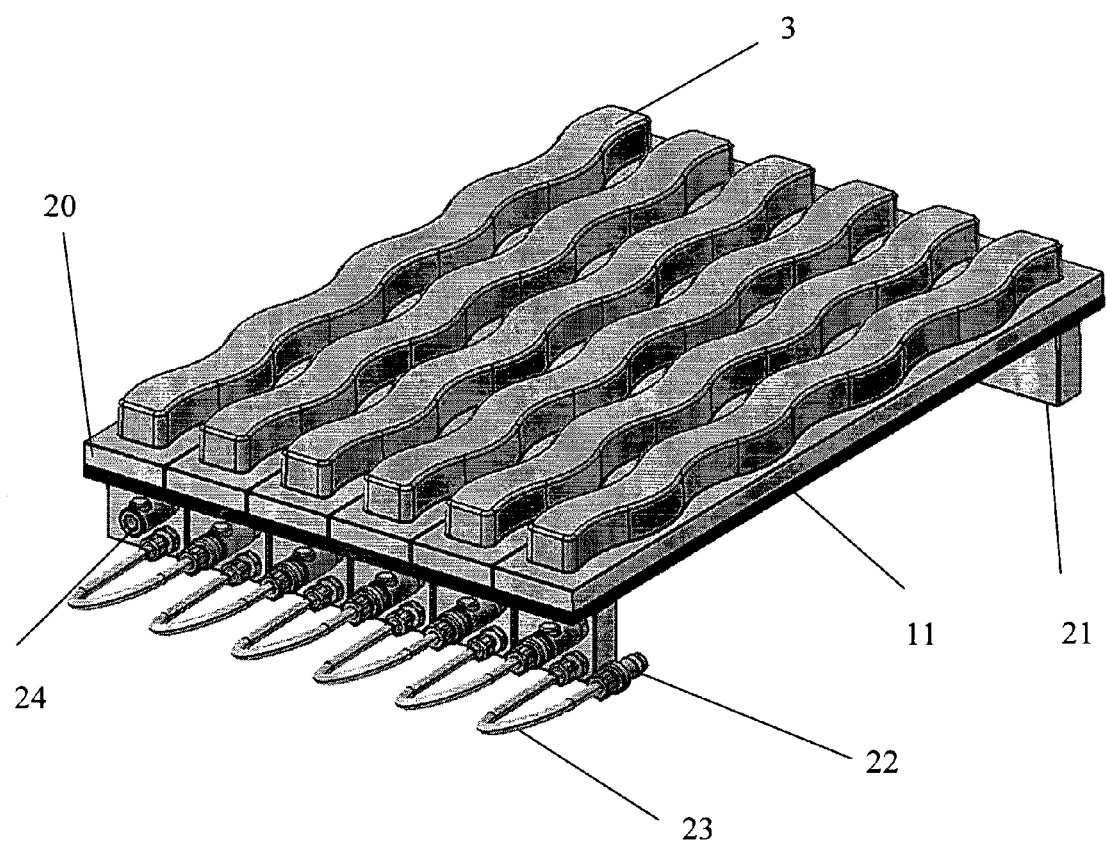
FIG. 3 shows a perspective view of an insert support according to this invention.

FIG. 3 shows an example of the implementation of this invention which is particularly suitable for supporting electronic cards. In the example shown, six support modules are placed side by side to adapt to the width of the card, which is not shown here for the sake of clarity of the drawing. Each module consists of a deformable closed enclosure of constant volume (3) which rests on a rigid base (11). The interior of each deformable enclosure (3) is connected to a self-plugging connector (24) and a connecting end (22) mounted on a flexible pipe (23). Thus to make a support adapted to the width of a card, the appropriate number of modules are placed side by side and each module is connected to the preceding module via connectors (24) and ends (22) as shown in FIG. 3. The first module is connected to a vacuum source which is not shown, via its connecting end (22). In this way the vacuum can be applied or cancelled simultaneously in all the deformable enclosures (3). As may be observed, the membranes of the deformable enclosures (3) have longitudinal corrugations to improve the support. In actual fact, to best distribute the support stress especially when electronic cuts which are precut have to be supported, it is wise for the membrane to be corrugated so as to minimise the distance between two adjacent modules. Obviously the shapes and dimensions of the supporting enclosures may vary considerably without departing from the scope of this invention.

Figure 4:
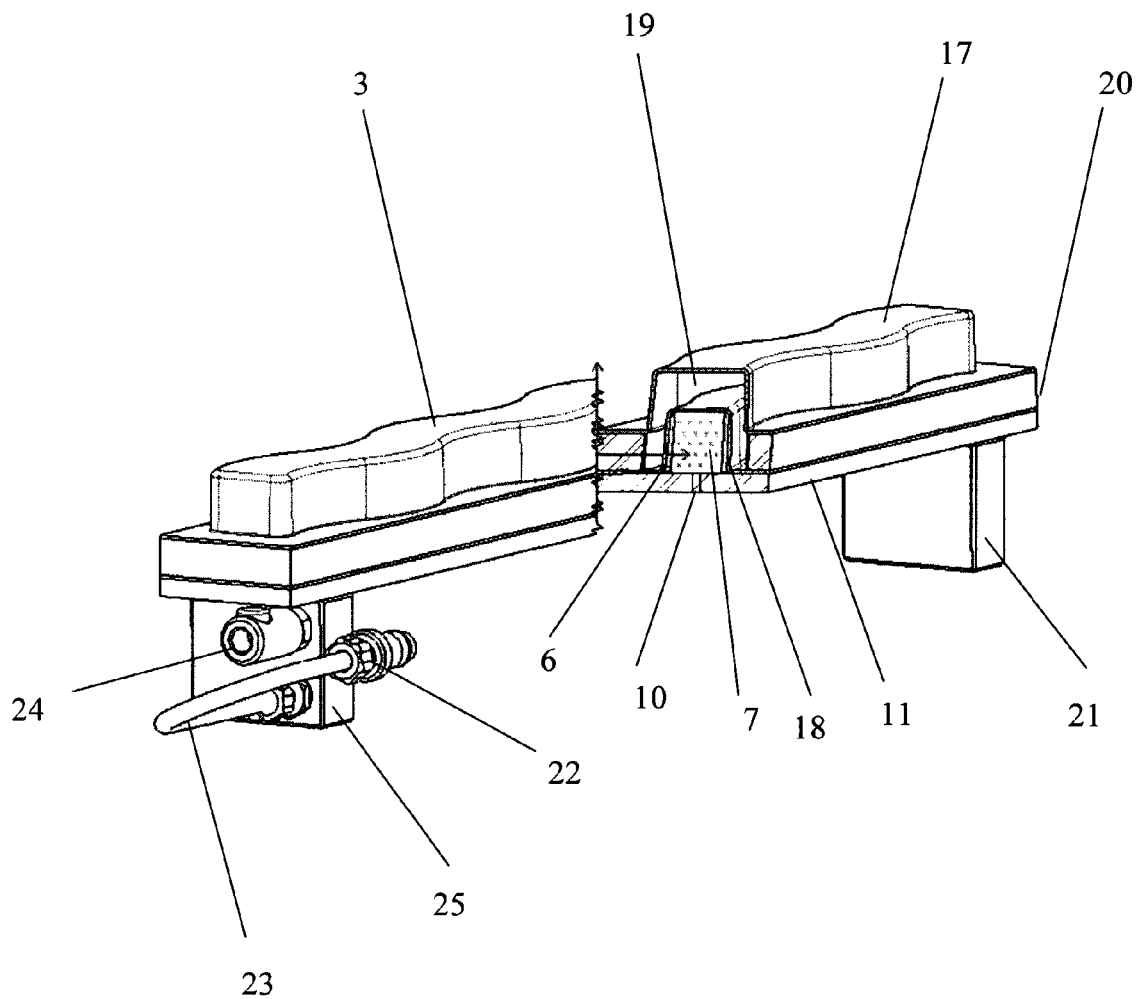
FIG. 4 shows a perspective section of a supporting insert module according to this invention.

FIG. 4 shows a section and perspective view of a support module according to this invention. As may be observed, the closed deformable enclosure (3) here consists of a soft upper membrane (17), a soft lower membrane (18) and a crosspiece (20). The closed volume (19) consisting of the deformable enclosure (3) is completely filled with incompressible particles, not shown on the drawing, and is connected to a vacuum source via the connecting end (22) and flexible pipe (23). The upper membrane (17) adheres to the crosspiece (20). Thanks to its concave shape, the lower membrane forms a hollow filled with a deformable elastic body (7) which in this case is an open-cell foam such as Bultex. The deformable enclosure rests on a rigid base (11) with a vent (10) which offers an opening to the exterior from the volume formed by the concave shape (6). The rigid base (11) is mounted on blocks (21) and (25) which give the desired height to the assembly depending on the type of machine implementing the insert support of this invention. The block (25) also allows the self-plugging connector (24) and the flexible pipe (23) to be connected to the deformable closed enclosure (3). As the volume (19) of the closed enclosure (3) is totally filled with incompressible particles (4), this ensures the locking or amalgamation of the particles (4) at constant volume with no shrinkage when vacuum is applied in the enclosure (3), which is vital for good support. In actual fact the insert support is immobilised in the state it is in at the moment when the vacuum is applied. Obviously the shape and size of the deformable enclosure (3) may take different shapes without departing from this invention. According to another characteristic, the deformable enclosure is not straight but on each of its two longitudinal sides it forms a broken line forming angles which are alternately projecting and recessed in order to virtually reduce the inoperative distance of support between two adjacent modules.

To encourage the conforming of the holding or supporting insert according to the invention, it may be wise to use a shape adapted to the part to be held and to apply it to the latter during conforming so that the enclosure deforms and perfectly matches the shapes of the part. By way of example, in the case of fine and/or warped electronic cards, it is wise to place as a backing a flat plate on the upper side of the card during the insert conforming stage, so as to correctly define the reference work level. This plate, the same size as or larger than the card, enables the printed circuit to be both straightened and held in a plane during conforming. Thus the subsequent cards of the same series will benefit from the insert thus conformed, and will therefore be supported and held in the same reference work plane. In fact, in the case of electronic cards, it is important to conform the universal insert of this invention in the desired ideal position and not in an uncontrolled random position. The support of this plate may be assisted by a suction system or any other suitable device.

According to another characteristic of the invention, the airtight closed enclosure may consist of one or several deformable membranes. If the enclosure consists of several membranes, these membranes may be assembled on an intermediate part. In all cases, the airtight enclosure consists of at least one closed deformable membrane which is in contact with the part to be held.

To avoid that the operation of conforming the airtight enclosure lifts the part to be held, it is possible to add a suction device to the insert of this invention.

Obviously many arrangements and shapes of deformable enclosures may be envisaged without departing from this invention.

In addition to the application for holding electronic cards equipped with components during the various assembly stages, this invention may be used in other fields such as mechanical engineering, joinery, etc. for supporting and/or holding complex parts for example during machining or handling operations.

According to another characteristic of the invention, the level of firmness of the insert may be adjusted depending on the level of vacuum applied in the closed enclosure(s). This is particularly interesting if there are slight differences between parts in the same series. By way of example, if electronic cards of the same batch have to be supported, it is possible that the position of certain components on the bottom side varies slightly from one card to another. Thus depending on the level of vacuum applied in the closed enclosure(s), the latter will accept localised deformations without this impairing the overall support of the card. Thus the support according to the invention permits some tolerance to variations in shapes from one part to another, and it is ensured that no local high stress is applied that would risk damaging a component. By way of example, the device which can automatically regulate the level of vacuum may be an adjustable regulated venturi such as COVAL. It has been seen above that it is possible, depending on the thickness of the membrane constituting the closed enclosure and/or the size of the compressible particles, to obtain conforming which is more precise or less precise. In fact, the thicker the membrane and/or the larger the particles, the less precise will be the conforming around the components on the bottom side.

APPLICATIONS

The process and the device according to the invention allow all the advantages of the flexible devices currently on the market and special dedicated tools to be combined, and eliminates all the disadvantages of both. This accumulation of advantages obliterates all the existing processes used especially on serigraphy machines, and consequently opens prospects of new applications, for example on machines for fitting components where the problem of needing to improve the support is not obvious yet, but will become so with the use of a shape-memory universal process.

Applications can be envisaged, for example for marking different objects of widely varying shapes by serigraphy or tampography. The process can also find advantageous applications in all fields where it is necessary to support objects of complex shapes during handling or work in very diverse industrial and artisanal sectors, and in this case the shape and ergonomics of the device according to the invention will be adapted to the objects. Similarly, it is possible to make parts or portions of moulds for various objects.

The invention claimed is:

1. A universal support insert for supporting a part (1) of random and/or complex shape that with a surface that can match the shapes of the said part (1), the apparatus comprising:
    a rigid base (11);
    a deformable enclosure (3), containing incompressible particles (4) and comprising a hole which is connected or is connectable to a vacuum source ;
    the enclosure (3):
        is in contact with the rigid base (11),
        is totally filled with said particles (4),
        has a part contacting surface positioned to contact a part (1) to be held,
        is deformable at constant volume,
        has a rest position which the enclosure adopts when the enclosure is not evacuated and no part is in place for support,
        maintains a constant volume when the enclosure is evacuated and when the enclosure is not evacuated,
        becomes immobilised without shrinking in a shape and in a work position determined by a said part (1) contacting the flexible surface when vacuum is applied to the enclosure, and
        has on the outside at least one concave shape (6) which crushes when the enclosure and the part are placed in the work position so as to permit large deformations when there is no vacuum in the enclosure (3), and the said concave shape (6) is open to
    the outside to permit the discharge or intake of air in the concave zone during crushing or
    a return to the rest position of the enclosure, and
    at least one said concave shape (6) is open to the outside of the enclosure and is totally or partially filled by a deformable elastic body (7) so as to give elasticity to the insert when vacuum is not applied in order to bring the enclosure (3) back to the rest position.

2. The universal support insert according to claim 1, characterised by the fact that it consists of several modules that can be placed side by side to adapt to the width of the part (1) to be held.

3. The universal support insert according to claim 2, characterised by the fact that a vacuum reservoir is combined with the insert to compensate for possible leaks.

4. The universal support insert according to claim 3, characterised by the fact that each enclosure has a longitudinal corrugation to improve the support.

5. The universal support insert according to claim 2, characterised by the fact that it is combined with a device for automatically regulating the vacuum level in the enclosure.

6. The universal support insert according to claim 5, characterised by the fact that each enclosure has a longitudinal corrugation to improve the support.

7. The universal support insert according to claim 2, characterised by the fact that each enclosure has a longitudinal corrugation to improve the support.

8. The universal support insert according to claim 1, characterised by the fact that each enclosure has a longitudinal corrugation to improve the support.

9. The universal support insert according to claim 1 comprising a plurality of said enclosures.

10. The universal support insert according to claim 9 comprising a plurality of said concave shapes (6) which are open to the outside of the enclosures and are totally or partially filled by a said deformable elastic body (7).

11. An apparatus comprising a universal support insert according to claim 1 and a vacuum source connected to the hole of said enclosure.

* * * * *